(12) United States Patent
Metzger et al.

(10) Patent No.: US 7,847,637 B2
(45) Date of Patent: Dec. 7, 2010

(54) HIGH EFFICIENCY PRECISION AMPLIFIER

(75) Inventors: Juergen Metzger, Pliezhausen (DE);
Mikhail V. Ivanov, Erlangen (DE);
Vadim V. Ivanov, Tucson, AZ (US);
Viola Schaffer, Erlangen (DE)

(73) Assignee: Texas Instrumentsdeutschland GmbH, Freising (DE)

( * ) Notice: Subject to any disclaimer, the term of this patent is extended or adjusted under 35 U.S.C. 154(b) by 0 days.

(21) Appl. No.: 12/491,081

(22) Filed: Jun. 24, 2009

(65) Prior Publication Data

US 2010/0019844 A1    Jan. 28, 2010

Related U.S. Application Data

(60) Provisional application No. 61/141,408, filed on Dec. 30, 2008.

(30) Foreign Application Priority Data

Jun. 27, 2008    (DE)    ............ 10 2008 030 576

(51) Int. Cl.
*H03F 3/04*    (2006.01)
(52) U.S. Cl. ............ 330/297; 330/136; 330/251
(58) Field of Classification Search ........... 330/136, 330/251, 10, 207 A, 297, 127
See application file for complete search history.

(56) References Cited

U.S. PATENT DOCUMENTS

| | | | | |
|---|---|---|---|---|
| 5,990,751 | A * | 11/1999 | Takita | 330/297 |
| 6,373,340 | B1 * | 4/2002 | Shashoua | 330/297 |
| 7,456,686 | B2 * | 11/2008 | Nadd | 330/10 |
| 7,701,293 | B2 * | 4/2010 | Baldwin et al. | 330/297 |
| 7,755,431 | B2 * | 7/2010 | Sun | 330/297 |
| 2006/0284673 | A1 | 12/2006 | Peruzzi et al. | |

FOREIGN PATENT DOCUMENTS

| EP | 0 443 507 | 8/1991 |
|---|---|---|
| EP | 0 483 094 | 4/1992 |

* cited by examiner

*Primary Examiner*—Hieu P Nguyen
(74) *Attorney, Agent, or Firm*—John J. Patti; Wade J. Brady, III; Frederick J. Telecky, Jr.

(57) ABSTRACT

A high efficiency precision amplifier which comprises a linear amplifier stage, a class D amplifier stage and a set of switches is provided. Both amplifier stages receive the same input signal. The load is driven by the output of the linear amplifier stage. The set of switches connect the output of the class D amplifier stage to either of the positive and negative supply terminals of the linear amplifier stage and the other of the positive and negative supply terminals of the linear amplifier stage to a negative or positive supply, depending on the polarity of the signal being amplified.

7 Claims, 2 Drawing Sheets

HIGH EFFICIENCY PRECISION AMPLIFIER

CROSS-REFERENCE TO RELATED APPLICATIONS

This patent application claims priority from German Patent Application No. 10 2008 030 576.6, filed 27 Jun. 2008, and from U.S. Provisional Patent Application No. 61/141,408, filed 30 Dec. 2008, the entireties of which are incorporated herein by reference.

FIELD OF THE INVENTION

The present invention relates to a high efficiency precision amplifier.

BACKGROUND

Typical precision amplifiers for industrial driver applications are linear amplifiers with a class AB output stage. They provide accurate signal processing at low output noise, at the expense of poor power efficiency. The dissipated power usually even exceeds the load power. Examples are the XTR300 and XTR111 precision amplifiers of Texas Instruments Incorporated.

Class D amplifiers and switching DC-DC converters have a high efficiency of typically more than 80%, but have a low bandwidth (a fraction of the switching frequency) and require a large inductor and capacitor at the output. They also have high output noise related to the switching frequency. An example is the TPA3001 class D amplifier of Texas Instruments Incorporated.

To achieve high accuracy and high speed at high efficiency, a switch-mode assisted linear amplifier has been proposed by Ertl et al., "Basic considerations and topologies of switch-mode assisted linear amplifiers", *IEEE Transactions on Power Electronics*, Vol. 44, No. 1, February 1997. This concept uses a linear amplifier in parallel with a class D amplifier. The class D amplifier is controlled by the output current of the linear amplifier, which allows unloading a low-frequency fraction of the linear amplifier output current. However, this concept needs a large inductor and load capacitor for operation. A large inductor limits the slew rate and efficiency with a highly dynamic load as the dI/dt through the inductor is limited, just as the dV/dt across a large capacitor. In addition, if used as an analog signal driver for industrial applications, the load is complex, i.e. resistive and capacitive, and long wires even may add inductance. The required output may be constant voltage or current. A class D amplifier, even in the context of a switch-mode assisted linear amplifier, would have great difficulty to handle the large variety of complex loads.

SUMMARY

The present invention provides a high efficiency precision amplifier that does not need a large inductor and has no requirements for the load capacitor.

Specifically, a high efficiency precision amplifier is provided in accordance with a preferred embodiment of the present invention which comprises a linear amplifier stage, a class D amplifier stage and a set of switches. Both amplifier stages receive the same input signal. The load is driven by the output of the linear amplifier stage. The set of switches connect the output of the class D amplifier stage to either of the positive and negative supply terminals of the linear amplifier stage and the other of the positive and negative supply terminals of the linear amplifier stage to a negative or positive supply, depending on the polarity of the signal being amplified. With this concept, the linear amplifier stage provides the full load current, but the effective supply voltage at the linear amplifier stage is small since it is always the difference between either of the positive or negative supply rail on the one hand and the output voltage of like polarity at the class D amplifier stage on the other hand. Accordingly, the power dissipation of the linear amplifier stage is low and the overall efficiency is high. Since it is the linear amplifier stage that supplies the full load current, high accuracy of signal processing is ensured.

The class D amplifier stage can have a small inductor with large current ripple due to the switching, which allows a fast reaction to load changes and ensures high efficiency even with a highly dynamic load.

In a preferred embodiment, a buffer capacitor is connected across the supply terminals of the linear amplifier stage. The value of the buffer capacitor should be quite large to support load variations without saturation of the linear amplifier stage.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

Further details will become apparent from the following description of a preferred embodiment with reference to the appending drawings.

DETAILED DESCRIPTION OF THE DRAWINGS

Figure 1:
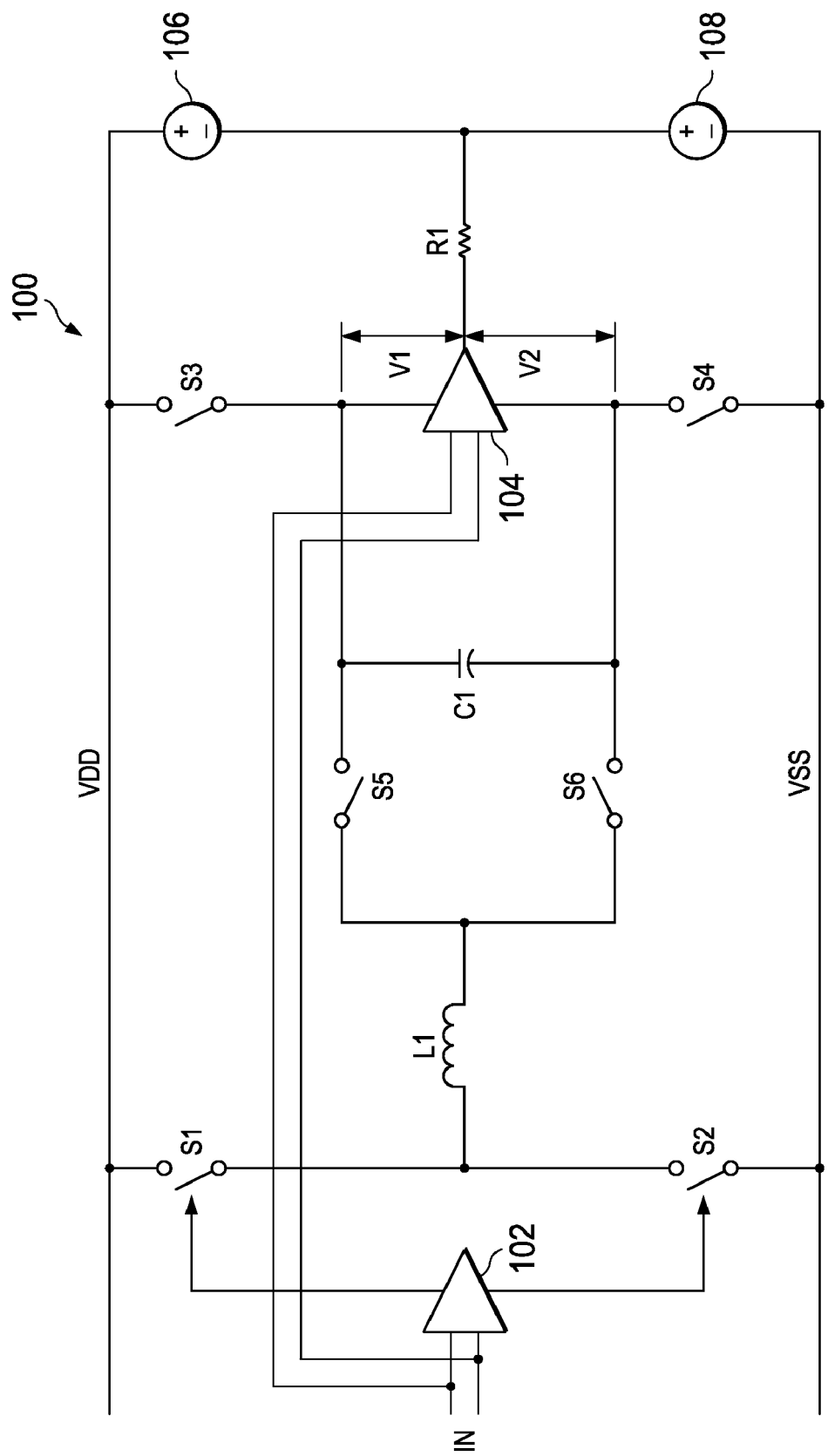
FIG. 1 is an example of a circuit diagram showing the a high efficiency precision amplifier in accordance with a preferred embodiment of the present invention.
Figure 2:
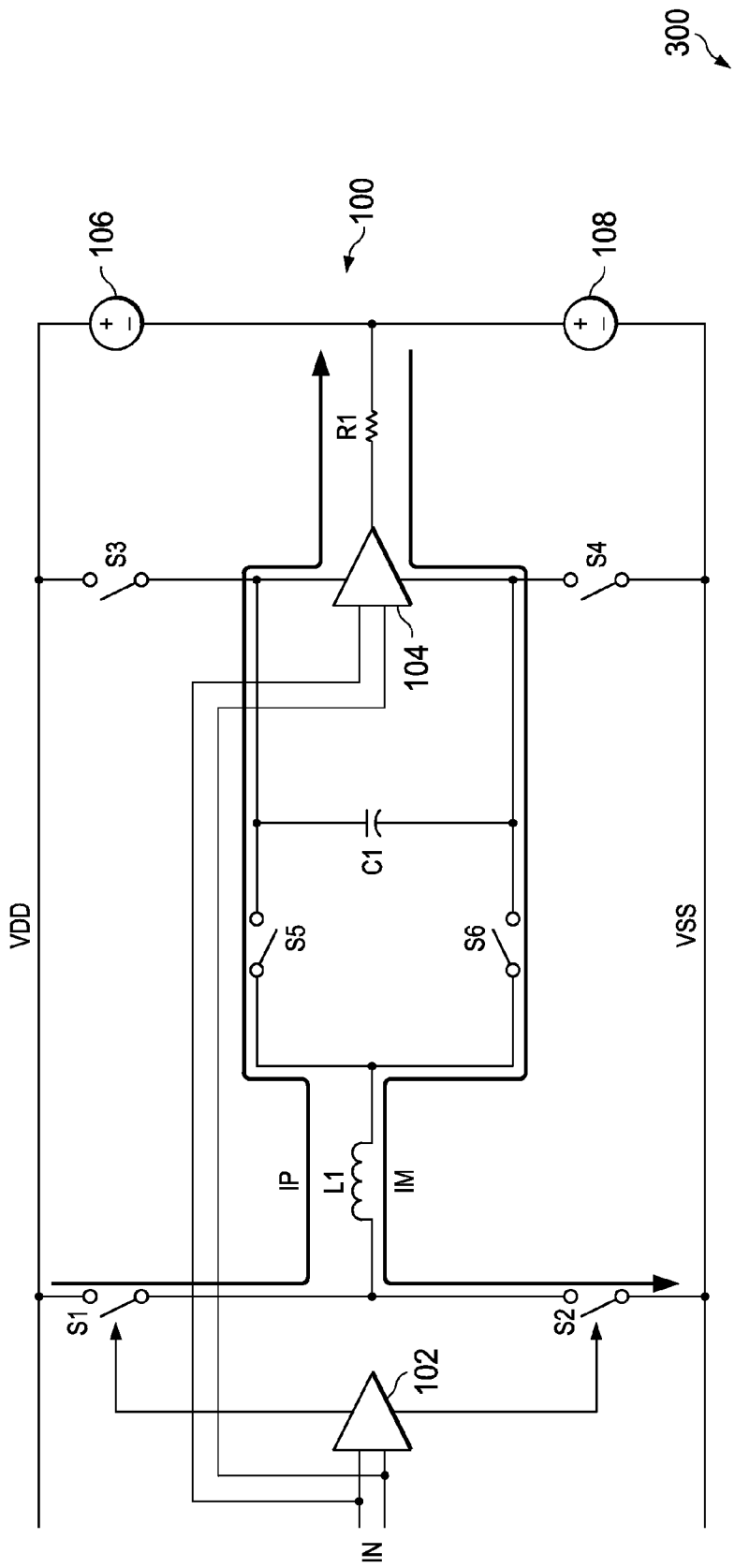
FIG. 2 is the same diagram with current flow paths inserted for positive and negative half-waves of an amplified signal.
Figure 3:
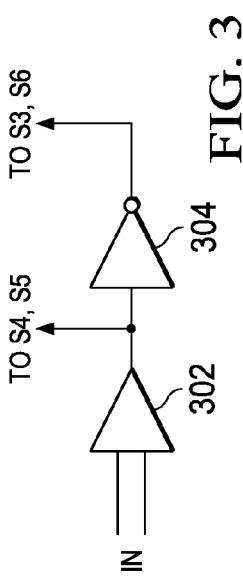
FIG. 3 is a schematic block diagram of a switch control circuit.

Referring to FIGS. 1 and 2 of the drawings, the reference numeral 100 generally designates an amplifier in accordance with a preferred embodiment of the present invention. Amplifier 100 generally comprises a class D amplifier stage (with a driver circuit 102 and switches S1 and S2) and a linear amplifier stage (with an amplifier 104 and switches S2 through S6). A switch control circuit 300 (as shown in FIG. 3) is also part of the linear amplifier stage. Driver circuit 102 and amplifier 104 both receive the same input signal IN. Switches S1 and S2 are connected in series between a positive supply rail VDD and a negative supply rail VSS (respectively) and are controlled by outputs from driver circuit 102. The interconnection node of switches S1 and S2 is the output of the Class D amplifier stage, and an inductor L1 is connects the output of the class D amplifier stage to the supply inputs of the following linear amplifier stage through parallel switches S5 and S6, where one of is closed at a time. A buffer capacitor C1 is connected across the supply terminals of linear amplifier stage. The supply terminals of the linear amplifier stage are also connectable to the positive and negative supply rails VDD and VSS through switches S3 and S4, respectively, where one of which can be closed at a time.

The positive and negative supply rails VDD and VSS are derived from two series connected DC sources 106 and 108, respectively. A load R1 is connected between the interconnection node of the DC sources 106 and 108 and the output of the linear amplifier stage.

Switches S3 through S6 are controlled by a switch control circuit based on a polarity detection of input signal IN. As seen in FIG. 3, the switch control circuit 300 is generally comprised of a comparator 302 which receives the signal IN at its inputs and an inverter 304. Comparator 302 directly provides the control signal for switches S4 and S5 on its output, and inverter 304 provides the control signal for switches S3 and S6 on its output.

It should be understood that in a practical implementation all components of the amplifier 100 can be included in an integrated circuit, a CMOS circuit in particular, and all switches S1 through S6 can be implemented as internal or external power FETs. Also, the inductor L1 and the capacitor C1 can be external elements.

In operation, the switch control circuit 300 of FIG. 3 detects the polarity of the input signal IN to be amplified, which is applied to driver circuit 102 and to the linear amplifier stage as well as to the complementary inputs of the comparator 302 of the switch control circuit.

With reference now to FIG. 2, when a positive signal part is detected by the switch control circuit, switches S4 and S5 are closed while switches S3 and S6 are open, and a current $I_P$ passes from the positive supply rail VDD through closed switch S1, inductor L1, closed switch S5, and amplifier 104 into the load R1. Since the positive supply voltage to amplifier 102 is provided by the output of the class D stage (as filtered by inductor L1), only a small voltage V1 is developed between the positive supply node of amplifier 102 and its output. It is this voltage V1 that accounts for the power dissipation in amplifier 104 during the positive portion of the input signal IN.

Likewise, when a negative signal part is detected by the switch control circuit, switches S3 and S6 are closed while switches S4 and S5 are open, and a current $I_M$ passes from the interconnection node of DC sources 106 and 108 through the load R1, amplifier 102, closed switch S6, and inductor L1 to the negative supply rail VSS. Since the negative supply voltage to amplifier 102 is provided by the output of the class D stage (as filtered by inductor L1), only a small voltage V2 is developed between the negative supply node of amplifier 102 and its output. It is this voltage V2 that accounts for the power dissipation in amplifier 102 during the negative portion of the input signal IN.

It is thus seen that the voltage drop V1 or V2 across the linear amplifier stage for either of the current paths $I_P$ and $I_M$ is small so that the power dissipation on amplifier 102 is low. With a typical efficiency of above 80% for the class D stage an overall efficiency of 70% to 80% can be achieved with the new concept. At the same time, the load current is solely the output current of the linear amplifier stage which thus determines the high accuracy of signal processing.

As the rate of change of current (dI/dt) value on the output of the class D stage is limited by the value of the inductor L1 and by the supply voltage, the value of the bypass capacitor C1 should be large enough to account for load variations without saturation of the linear amplifier stage. The bypass capacitor C1 ensures continuity of the supply voltage for the linear amplifier stage A1 and also the filtering of the output current from the class D stage.

Since the load current is supplied by the linear amplifier stage, no load capacitance is required. The class D stage can have a small inductor even though relatively large current ripple results. A small inductor allows fast reaction to load changes and improves efficiency even with a highly dynamic load.

Although the simplified circuit diagram in the figures shows the linear amplifier stage as being directly supplied from the supply rails VDD and VSS, it should be clear that the linear amplifier stage could have an output stage with separate supply sources.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a first voltage rail;
   a second voltage rail;
   a first switch that is coupled to the first voltage rail;
   a second switch that is coupled to the second voltage rail and to the first switch;
   a driver that receives an input signal and that is coupled to each of the first and second switches so as to actuate and deactuate the first and second switches;
   an inductor coupled to the node between the first and second switches;
   a third switch that is coupled between the inductor and the first voltage rail;
   a fourth switch that is coupled between the inductor and the second voltage rail; and
   an amplifier having a signal input terminal, a first power input terminal, a second power input terminal, and an output terminal, wherein the signal input terminal receives the input signal, and wherein the first power input terminal is coupled to the third switch, and wherein the second power input terminal is coupled to the fourth switch.

2. The apparatus of claim 1, wherein the third switch further comprises a pair of switches that are coupled in series with one another, and wherein the first power input of the amplifier is coupled to the node between the pair of switches.

3. The apparatus of claim 1, wherein the fourth switch further comprises a pair of switches that are coupled in series with one another, and wherein the second power input of the amplifier is coupled to the node between the pair of switches.

4. The apparatus of claim 1, wherein the apparatus further comprises a capacitor that is coupled between the first and second power input terminals of the amplifier.

5. The apparatus of claim 1, wherein the apparatus further comprises:
   a comparator that receives the input signal and that is coupled to the third switch so as to actuate and deactuate the third switch; and
   an inverter that is coupled to the comparator and the fourth switch so as to actuate and deactuate the fourth switch.

6. The apparatus of claim 1, wherein the apparatus further comprises:

a first voltage supply that is coupled to the first voltage rail; and a second voltage supply that is coupled between the second voltage rail and the first voltage supply.

7. An apparatus comprising:

a first voltage rail;

a second voltage rail;

a first voltage supply that is coupled to the first voltage rail;

a second voltage supply that is coupled between the second voltage rail and the first voltage supply;

a first switch that is coupled to the first voltage rail;

a second switch that is coupled to the second voltage rail and to the first switch;

a driver that receives an input signal and that is coupled to each of the first and second switches so as to actuate and deactuate the first and second switches;

an inductor coupled to the node between the first and second switches;

a third switch that is coupled to the inductor;

a fourth switch that is coupled between the third switch and the first voltage rail;

a fifth switch that is coupled to the inductor;

a sixth switch that is coupled between the fifth switch and the second voltage rail;

a capacitor that is coupled between the third and fifth switches;

a comparator that receives the input signal and that is coupled to the third and sixth switches so as to actuate and deactuate the third and sixth switches; and an inverter that is coupled to the comparator and the third and fourth switches so as to actuate and deactuate the fourth switches; and an amplifier having a signal input terminal, a first power input terminal, a second power input terminal, and an output terminal, wherein the signal input terminal receives the input signal, and wherein the first power input terminal is coupled to the node between the third and fourth switches, and wherein the second power input terminal is coupled to the node between the fifth and sixth switches.

* * * * *